INVENTOR.
WESLEY E. PRATHER
BY
ATTORNEYS

United States Patent Office 3,230,480
Patented Jan. 18, 1966

3,230,480

FREQUENCY MODULATED RELAXATION OSCILLATOR UTILIZING A UNIJUNCTION TRANSISTOR

Wesley E. Prather, San Antonio, Tex., assignor to the United States of America as represented by the Secretary of the Air Force Filed June 4, 1963, Ser. No. 285,534
5 Claims. (Cl. 332—16)
(Granted under Title 35, U.S. Code (1952), sec. 266)

The invention described herein may be manufactured and used by or for the United States Government for governmental purposes without payment to me of any royalty thereon.

This invention relates to wave generators employing unijunction transistor, and in particular to a frequency modulated relaxation oscillator circuit.

The unijunction transistor is described in detail in U.S. Patent 2,769,926 of I. A. Lesk. This transistor may be considered as having an elongated semiconductor body, with a bilaterally conducting base at each end, and a rectifying junction between the ends. In normal operation, a unidirectional bias is applied between the base electrodes, and the junction electrode is biased at a potential intermediate to the inter-base potentials. The usual operating potential is such that the voltage at the junction boundary is near zero, a condition providing minimum current at the junction, which is the region of greatest non-linearity. If a greater reverse bias is applied to the junction, relatively little additional current flows through the device, since it presents a high impedance, both between the two bilateral bases, and also between the junction and either base. If, however, there is a slightly forward bias at the junction, holes or electrons (depending on whether the device is a PN or NP type device) injected into the semiconductor bar suddenly lower the impedance of the device between the junction and the base in the easy flow direction; this allows the device to operate as an effective switch, controlled by a voltage between the emitter and a base.

The unijunction transistor is characterized by an input voltage versus output current curve which is N-shaped, having a negative resistance region, thus adapting the device for application to many kinds of switching and wave generating circuits. The N-shape curve is the result of a slightly forward bias at the emitter junction which lowers the impedance of the semiconductor between the junction and the base in the easy flow direction. The sudden drop of impedance causes a large and sudden increase in current both through the junction as well as between the bases.

The unijunction transistor has a high maximum conductivity which can be readily switched on and off. This makes the transistor ideally suited for use in wave generating and oscillatory circuits wherein, for example, a capacitor may be periodically charged and discharged. The low impedance of the transistor allows a capacitor to be discharged very rapidly, thus effecting extremely sharp rise times in the output waveform.

Some of the circuits utilizing the unijunction transistor are described in U.S. Patent 2,968,770, Sylvan, and Patent 3,026,485, Suran.

It is one object of this invention to provide an improved relaxation oscillator circuit of greater stability, sensitivity, and simplicity.

It is another object of this invention to provide an improved frequency-modulated oscillator requiring a low input modulating power and a high output power.

It is another object of this invention to provide a frequency-modulated oscillator with a high input impedance, thus allowing improved isolation between the input modulating signal and the output signal.

These and other advantages of the invention will be more clearly understood from the following description taken in connection with the accompanying drawings.

In the drawings, FIGURE 1 is a schematic diagram of a wave generator circuit embodying the present invention;

Figure 1:
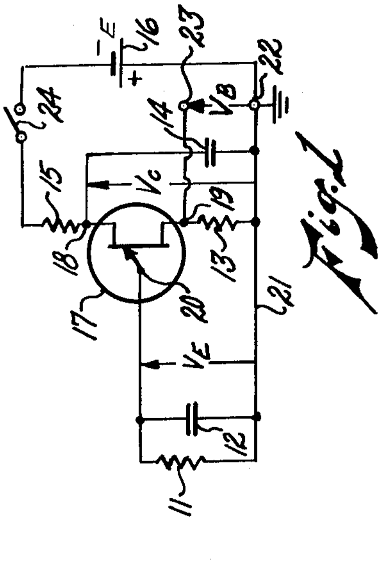

Referring now particularly to FIGURE 1, capacitor 14 is connected through charging resistance 15 and switch 24 to the negative terminal of a source of operating potential 16, the positive terminal of which is connected through ground bus 21 to one side of resistor 13; the other side of resistor 13 is connected to base electrode 19 of unijunction transistor 17. The junction of resistance 15 and capacitance 14 is connected to base electrode 18 of transistor 17, while the rectifying junction 20 of the unijunction transistor is connected to resistance 11 in parallel with capacitor 12. The other side of resistance 11 and capacitor 12 is connected to ground bus 21; the ground bus 21 is also connected to terminal 22, one of the output terminals, and also to the remote side of capacitor 14. The other output terminal 23 is connected to base electrode 19.

Figures 2, 3:
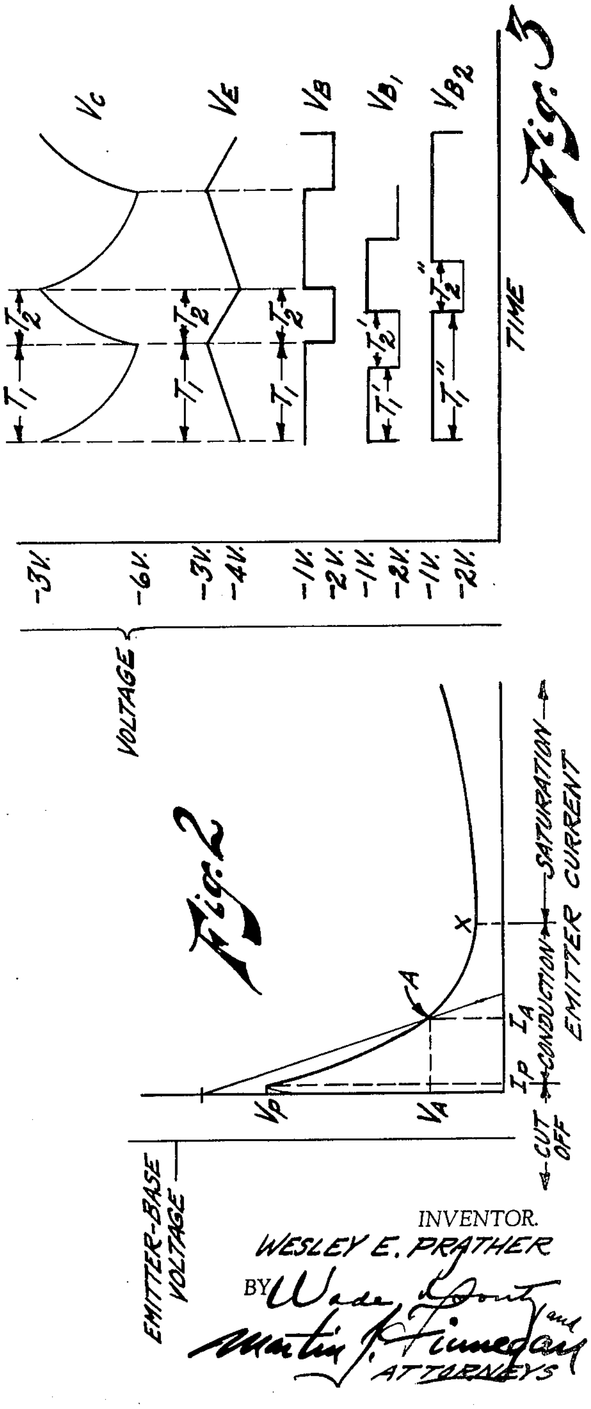
FIGURE 2 is a diagram showing the operating characteristics of the unijunction transistor utilized in the circuit of FIGURE 1.
FIGURE 3 shows a family of graphs of the voltages at various points in the circuits of FIGURE 1.

When an operating potential from a direct current source is applied across the base electrodes of the unijunction transistor 17, the base 18 becomes negative with respect to base 19; a potential of gradually increasing magnitude is applied between the emitter 20 and base 18. Normally, emitter 20 is back biased, and no current would flow from emitter 20 to base electrode 18. As the potential of base electrode 18 is increased in a negative direction, a point $V_P$ is reached, as shown on the graph of FIGURE 2, at which the emitter becomes positive with respect to the potential existing in the semiconductor of the transistor adjacent to the emitter. At this point, current starts to flow from the emitter 20 to base electrode 18. The flow of current between emitter 20 and base 18 causes a lowering of the resistance of the semiconductor, thus causing a further increase of current, which again causes a decrease in resistance. This action is regenerative, so that the voltage between emitter 20 and base 18 necessary to sustain a particular current becomes infinitely small until a point X in FIGURE 2 is reached, at which point a further increase in current does not cause a further reduction in resistance. Further increase in voltage causes current to increase.

In the circuit of FIGURE 1, when switch 24 is closed, capacitor 14 is charged through resistor 15; thus charging voltage appears at base electrode 18, so that the electrode 18 potential becomes more negative with respect to emitter 20; when the voltage across capacitor 14 reaches a value so that the difference in voltage between emitter 20 and base 18 is equal to $V_P$ in the graph of FIGURE 2, current flows from the emitter 20 to base electrode 18, and the emitter-base voltage quickly drops to point A on the graph; capacitor 12 is charged, and capacitor 14 is discharged. The voltage waveforms across capacitor 14 and capacitor 12 are shown as $V_C$ and $V_E$, respectively, in FIGURE 3.

While capacitor 12 is charging, current flows through the low impedance path of the unijunction transistor, both from capacitor 14 through emitter 20 to capacitor 12, and also from base 18 to base 19 through resistor 13. Since this current increases very rapidly, the voltage developed by this current through resistor 13 will have a very sharp leading edge, as can be seen by waveform $V_B$ in FIGURE 3.

When capacitor 14 discharges so that the potential at base 18 is no longer sufficiently negative to sustain the emitter current, the terminals between emitter 20 and base 18 will then present a high impedance, and the current will very suddenly be cut off. Capacitor 12 will then discharge through resistor 11, and capacitor 14 will again be charged through resistor 15, and the entire cycle of events will recur.

The conditions which must be met to permit oscillation of the circuit are shown in the diagram of FIGURE 2. The current supplied to the emitter must be greater than the value $I_P$. The load line, formed by supply voltage E and the slope of emitter resistance, must intersect the N curve of the emitter to the left of the valley point X, in the negative resistance region. This will allow the preceding cycle of events to recur, when the emitter current will decrease from the cut off region to $I_P$, when it will very suddenly increase to $I_A$, with the emitter-base voltage falling to $V_A$; when capacitor 14 discharges, the emitter current will very quickly be cut off, and the cycle will repeat.

Hence it can be seen that due to the negative resistance of the unijunction transistor, when the increasingly negative voltage of base electrode 18 reaches a value so that the emitter-base voltage is equal to $V_P$, a regenerative action takes place which allows the current through the transistor to build up very rapidly; this enables the voltage waveform $V_B$ at resistor 13 to have a very sharp leading edge.

Figure 4:
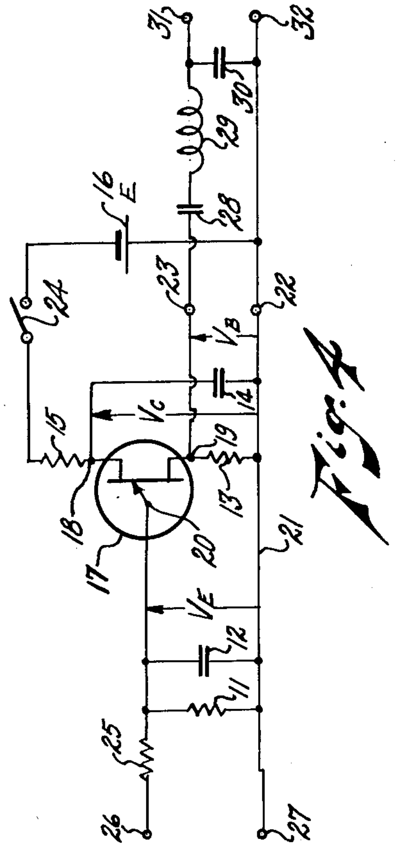
FIGURE 4 is a schematic diagram showing an application of the circuit of FIGURE 1.

A practical application of the circuit of FIGURE 1 is given in FIGURE 4. FIGURE 4 is identical to the circuit of FIGURE 1, with the following additions:

Resistor 25 is connected to emitter 20 of unijunction transistor 17; the other end of resistor 25 is connected to terminal 26 which, together with the grounded terminal 27, are the input terminals for a modulating signal. The previous output terminals 22 and 23 are connected to a filter circuit. Terminal 23 is connected to capacitor 28; the other side of the capacitor is connected to inductor 29, the remote side of which is terminated at the new output terminal 31. The other output terminal is ground terminal 32. Capacitor 30 is connected across terminals 31 and 32.

The operation of the circuit of FIGURE 4 is the same as that of FIGURE 1, except for the following additional elements. The purpose of the network of capacitors 28 and 30, and inductor 29, is to convert the pulse output at terminals 22 and 23, to a sine wave. The purpose of the modulating signal at terminals 26 and 27 is to vary the rate of discharge of capacitor 12. If the modulating signal is of positive polarity with respect to ground bus 21, capacitor 12, which is charged to a negative potential, is discharged more rapidly; if the modulating signal is of negative polarity, capacitor 12 is discharged less rapidly, compared to its discharge in the absence of a modulating signal. In effect, the modulating signal adds a charge to capacitor 12 when the signal is negative, and subtracts a charge when positive. This modulation results in an increase or a decrease of time $T_1$ in FIGURE 3, curves $V_{B2}$ and $V_{B1}$, thus providing a frequency modulation system.

The period $T_2$ during which capacitor 14 discharges is almost constant, while the period $T_1$ varies in response to the modulating signal. This oscillator is unique in that modulation is accomplished during the "off" period of unijunction transistor 17, while the output pulses at terminal 23 are taken during the "on" period $T_2$. This feature allows a low input modulating power, and a high output power.

Since modulation is applied during the "off" cycle of transistor 17, the circuit provides a high input impedance and high sensitivity to the modulating signal, since the current through the transistor at this time is very low. The circuit is very stable, and provides good isolation between the input modulating signal and the output signal at either terminals 22 and 23, or 31 and 32.

This circuit has many advantages over conventional FM oscillators. In existing oscillators, the charging capacitance is placed between base electrode 18 and the emitter circuitry; the charging voltage is applied to the capacitance through base electrode 19 of the unijunction transistor, and when the voltage reaches the charged level, the capacitance is discharged through base electrode 19. This results in an attempt to provide modulating energy during the charging cycle of the capacitor, when there is conduction from base 18 into the capacitor; the charging current is therefore affected by the modulation signal, and instability and low sensitivity result. In the circuit herein presented, the modulating signal reacts only with the discharge current of capacitor 12 to give better control of the output pulses.

Suitable components and circuit parameters are as follows:

11 Variable resistance, 1,000 to 50,000 ohms
12 1 to .001 microfarad, set for specific frequency $F_0$
13 Resistor, 1,000 ohms
14 Capacitor, 10 microfarads
15 Resistor, 6,000 ohms
16 Battery, 12 volts
17 Unijunction transistor 2N492
24 Single pole, single throw switch
25 Resistor, 1,000 ohms
28 Capacitor, 1 to .001 microfarad, set for $F_0$
29 Inductor, .25 to 4 Henrys, set for $F_0$
30 Capacitor, 1 to .001 microfarads, set for $F_0$.

While particular embodiments of the invention have been shown and described, it should be recognized that the invention is not limited thereto, and it is intended in the appended claims to claim all variations as fall in the true spirit of the present invention.

What I claim as new and desire to secure by Letters Patent of the United States is:

1. A frequency modulated relaxation oscillator comprising: a unijunction transistor having a first base, a second base, and an emitter, a first capacitor connected between said first base and said second base, a second capacitor connected between said emitter and said second base, means for charging said first capacitor when said transistor is non-conducting and for charging said second capacitor when said transistor is conducting, means for discharging said second capacitor when said transistor is non-conducting, and a pair of input terminals connected across said second capacitor for receiving a modulating signal for varying the period of discharge of said second capacitor to thereby modulate the frequency of said oscillator.

2. The combination set forth in claim 1, and in addition, means to change the output wave shape to sinusoidal form.

3. A wave generating circuit comprising a unijunction transistor having a first base electrode, a second base electrode, and an emitter electrode, an impedance and a first capacitor connected in series across a source of unidirectional operating potential, with the junction of said impedance and capacitor connected to said first base electrode and the other terminal of said capacitor connected to the second base electrode, said first capacitor being charged while said transistor is in the non-conducting state, and a parallel combination of an impedance and second capacitor connected between said emitter electrode and second base electrode, said second capacitor being charged while the transistor is in the conducting state, and means for deriving an output from said second base electrode.

4. A wave generating circuit comprising a unijunction transistor having a first base electrode, a second base electrode, and an emitter electrode, a charging resistor and a first capacitor connected in series across a source of unidirectional operating potential, the junction of said resistor and capacitor connected to said first base electrode, said first capacitor being charged while the transistor is in the non-conducting state, a parallel combination of a discharging resistor and second capacitor connected to the emitter electrode, said second capacitor being charged while the transistor is in the conducting state, a load impedance connected to the second base electrode, with the remote terminal of said parallel resistor and second capacitor, first capacitor and load impedance connected together, and means for deriving an output at said second base electrode.

5. A wave generating circuit comprising: a unijunction transistor having a single rectifying junction, a first base and a second base, a source of direct potential having positive and negative terminals, a first capacitor connected between said source and said first base, a first resistor interposed between said potential source and said first capacitor for controlling the charging thereof when said transistor is in a non-conducting state, a second capacitor coupled to the rectifying junction and the positive terminal of said potential source, a second resistor in parallel with said second capacitor for controlling the discharge thereof while the transistor is in the non-conducting state, means for applying a bias potential across the two bases of said unijunction transistor, and means for deriving an output at said second base.

References Cited by the Examiner

UNITED STATES PATENTS

| | | | |
|---|---|---|---|
| 3,047,789 | 7/1962 | Lowry | 333—111 X |
| 3,091,729 | 5/1963 | Schmidt. | |
| 3,149,293 | 9/1964 | Farkas | 331—111 X |

HERMAN KARL SAALBACH, *Primary Examiner.*

ROY LAKE, P. L. GENSLER, *Assistant Examiners.*